(12) United States Patent
Irsigler et al.

(10) Patent No.: US 8,895,418 B2
(45) Date of Patent: Nov. 25, 2014

(54) SEMICONDUCTOR DEVICE AND METHOD FOR PRODUCING A SEMICONDUCTOR DEVICE

(75) Inventors: Peter Irsigler, Obernberg/Inn (AT);
Thomas Neidhart, Klagenfurt (AT);
Guenter Schagerl, Finkenstein (AT);
Hans-Joachim Schulze, Taufkirchen (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 13/584,801

(22) Filed: Aug. 13, 2012

(65) Prior Publication Data
US 2013/0207223 A1  Aug. 15, 2013

(51) Int. Cl.
| | | |
|---|---|---|
| H01L 21/425 | (2006.01) | |
| H01L 21/265 | (2006.01) | |
| H01L 29/66 | (2006.01) | |
| H01L 21/3063 | (2006.01) | |
| H01L 29/06 | (2006.01) | |
| H01L 21/306 | (2006.01) | |
| H01L 29/08 | (2006.01) | |
| H01L 29/36 | (2006.01) | |

(52) U.S. Cl.
CPC .......... H01L 21/265 (2013.01); *H01L 29/0878* (2013.01); H01L 21/26513 (2013.01); H01L 29/66333 (2013.01); *H01L 29/36* (2013.01); *H01L 21/3063* (2013.01); H01L 29/0847 (2013.01); H01L 29/0603 (2013.01); H01L 21/30608 (2013.01); H01L 29/66136 (2013.01); *H01L 29/66712* (2013.01)

USPC .......................................... 438/527; 257/487

(58) Field of Classification Search
USPC .................. 438/527, 459, 455, 530, 690, 509
See application file for complete search history.

(56) References Cited

U.S. PATENT DOCUMENTS

| | | | |
|---|---|---|---|
| 6,960,798 B2 | 11/2005 | Deboy et al. | |
| 7,838,325 B2* | 11/2010 | Hsu et al. | 438/68 |
| 8,030,721 B2* | 10/2011 | Hsu et al. | 257/431 |
| 8,405,177 B2* | 3/2013 | Hsu et al. | 257/431 |
| 2009/0200585 A1* | 8/2009 | Nozaki et al. | 257/292 |
| 2010/0207230 A1* | 8/2010 | Hsu et al. | 257/446 |
| 2010/0210091 A1* | 8/2010 | Mauder et al. | 438/459 |

FOREIGN PATENT DOCUMENTS

| | | |
|---|---|---|
| DE | 102006046844 A1 | 4/2008 |
| DE | 10 2008 056 195 A1 | 5/2009 |
| EP | 2 339 637 A1 | 6/2011 |

OTHER PUBLICATIONS

"An Electrochemical P-N. Junction Etch-Stop for the Formation of Silicon Microstructures" Jackson et al., IEEE Electron Device Letters, vol. EDL-2, No. 2, Feb. 1981.
"Electrochemically Controlled Thinning of Silicon" H.A. Waggener, BSTJ Brief, Dec. 31, 1969.

* cited by examiner

*Primary Examiner* — Bilkis Jahan
(74) *Attorney, Agent, or Firm* — SpryIP, LLC

(57) ABSTRACT

One embodiment describes a method of manufacturing a semiconductor device. Here, impurities are implanted into a semiconductor body via a first side of the semiconductor body. Thereafter, a drift zone layer on the first side of the semiconductor body is formed. The following is an ablation of the semiconductor body from a second side of the semiconductor body and up to pn junction defined by impurities.

23 Claims, 6 Drawing Sheets

SEMICONDUCTOR DEVICE AND METHOD FOR PRODUCING A SEMICONDUCTOR DEVICE

RELATED APPLICATIONS

This application claims priority benefit of German Patent Application 102011052605.6, which was filed on Aug. 11, 2011. The entire contents of the German Patent Application are incorporated herein by reference.

BACKGROUND

The application relates to a semiconductor device and a method for producing or manufacturing a semiconductor device.

For a variety of applications in which electronic semiconductor devices and integrated circuits (IC, integrated circuit) are used, it is advantageous to restrict the total thickness of the semiconductor devices or integrated circuits. For example, low weight and low height may be important for smart cards and smart cards applications. Likewise, the electrical properties of, for example vertical power semiconductor components, may be improved by achieving specific settings of the thickness of the semiconductor body.

For this purpose an accurate and reproducible thickness adjustment over the entire surface of the semiconductor body is desirable in order to avoid yield losses in the manufacture and to ensure reliable electrical properties of the semiconductor device or the integrated circuit.

SUMMARY

The detailed description is described with reference to the accompanying figures. In the figures, the left-most digit(s) of a reference number identifies the figure in which the reference number first appears. The use of the same reference number in different instances in the description and the figures may indicate similar or identical items.

Embodiments discussed in the following describe a method of manufacturing a semiconductor device, which allows reproducible thinning of a semiconductor body of the semiconductor device. Further embodiments are devoted to such semiconductor devices.

One embodiment relates to a method of manufacturing a semiconductor device. The method comprises implanting impurities into a semiconductor body on a first side of the semiconductor body. The method may include forming a drift zone layer on the first side of the semiconductor body and a removal of the semiconductor body from a side opposite the first second side of the semiconductor body up to the pn junction, defined by foreign materials, or a through the pn junction space charge zone or up to the foreign materials dopant concentration.

A semiconductor device according to an embodiment comprises a semiconductor body having a first side and a second side. The semiconductor device further comprises a plurality of field stop zones, which are formed within the semiconductor body and down to different depths. One or each of a plurality of field stop zones meets a vertical distance b1 from a maximum of a dopant concentration the respective field stop zone at half maximum in the direction of the first side and a vertical distance b2 from the maximum of the dopant concentration at half maximum in the direction of the second side of the relation $0,9 < b1/b2 < 1.1$.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

Figure 1A:
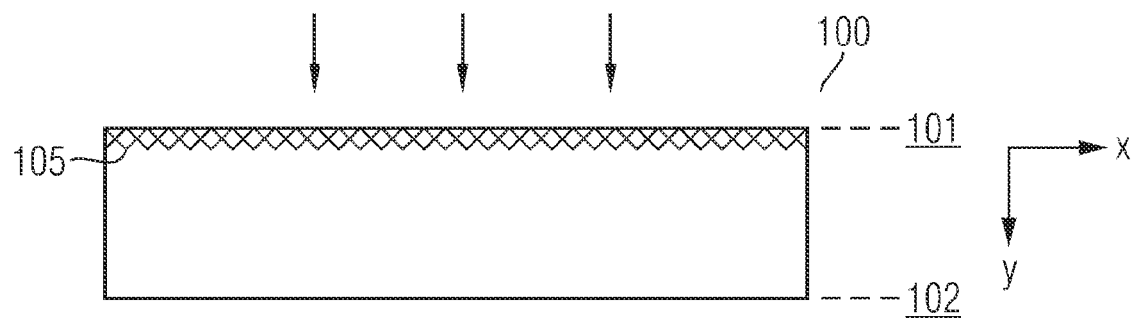
FIGS. 1A-1C illustrate schematic cross sectional views of a semiconductor body during a process for manufacturing. A semiconductor device may be implanted to thereby define a stop of a downstream stripping process of the semiconductor body.

Exemplary embodiments are described in greater detail with reference to the figures. The invention is not limited to the specifically described embodiments but can be suitably modified and altered. Individual features and feature combinations of one embodiment can be customized with features and feature combinations of other one or more embodiments, unless this is expressly excluded.

Before the following embodiments with reference to the figures are explained in detail, it should be noted that matching elements are provided in the figures with matching or similar reference numerals. In some cases, the description of such matching or similar reference numerals will not repeated. In addition, the figures are not necessarily shown to scale, since their focus is on the illustration and explanation of basic principles.

In the following, a pn junction is defined as a place in a semiconductor body on which an n-type dopant concentration under p-type a dopant concentration falls or a p-type dopant concentration under a n-type dopant concentration falls or a combination of p and n dopants.

Figure 1B:
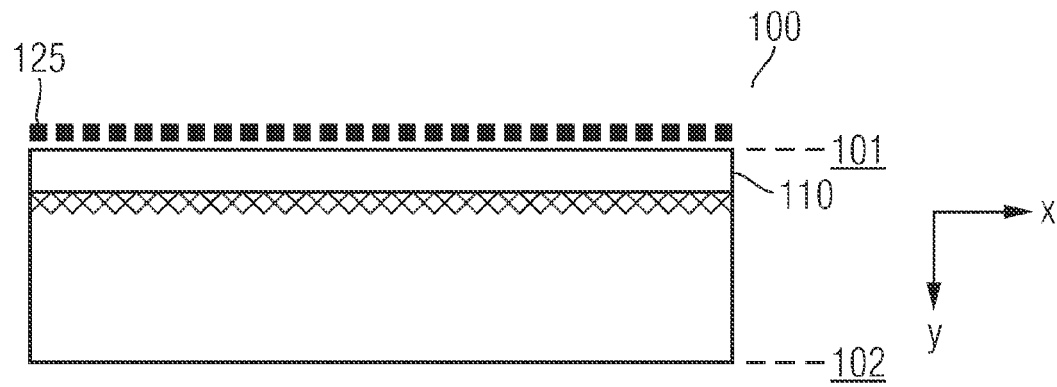
Figure 1C:
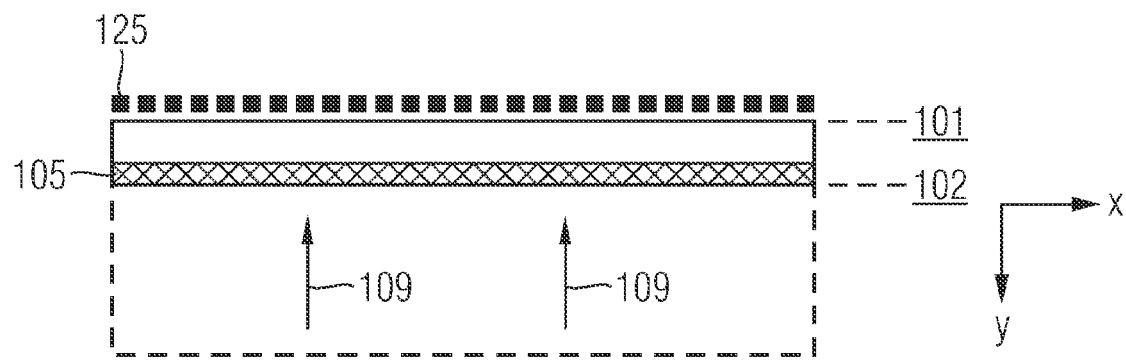

FIGS. 1A to 1C are schematic cross-sectional views of a semiconductor body 100 during different process stages of manufacturing a semiconductor device according to an embodiment.

In the schematic cross-sectional view of FIG. 1A, a semiconductor body 100 is shown having a first side 101 and a second side 102, wherein the perpendicular direction to the first side 101 and second side 102 is referred to as the y-direction and the parallel direction of the first side 101 and the second side 102 is referred to as the x-direction. The semiconductor body 100 typically comprises a semiconductor wafer, a so-called "wafer". The semiconductor wafer can for example be free of deposited semiconductor layers or have one or a plurality of layers on the first side 101 and/or the second side 102. According to one embodiment, the semiconductor body 100 includes a p-doped semiconductor substrate of silicon, i.e. a Si wafer, e.g. with a diameter of 8 inches (200 mm), 12 inches (300 mm) or 18 inches (450 mm).

Foreign materials or impurities 105 are implanted near a surface on the first side 101 into the semiconductor body 100. Such foreign materials may include, after activation of an n-type and/or p-type doping in silicon, for example, one or a combination of materials including, phosphorus, arsenic, antimony, selenium and sulfur.

As illustrated in FIG. 1B, a drift zone layer 110 may be formed over or on the first side 101 of the semiconductor body 100. The drift zone layer 110 may for example be epitaxially grown over the first side 101 of the semiconductor body 100. A thickness and a dopant concentration in the drift region layer 110 may be determined based on electrical requirements of the manufactured semiconductor device, for example based on a voltage class or on-resistance.

The formation of the drift region layer 110 on the semiconductor body 100 including the impurities 105 may occur before formation of one or more other layers over or in the semiconductor body.

Optionally, a preformed semiconductor layer or one or more layers of the semiconductor layer stack may be implanted with impurities. Thus, a plurality of field stop zones may be incorporated in a completed semiconductor component, such as an insulated gate bipolar transistor (IGBT), a diode or a field effect transistor (FET, Field Effect Transistor) or a metal-oxide semiconductor FET (MOSFET, Metal-Oxide-Semiconductor FET), to reduce the electric field and to prevent a "crackdown" of the electric field or the space charge zone back up to a highly doped region, such as an emitter region. The field stop zone or field stop zones of a field stop zone stack may be structured and formed by a previously implanted field stop zone implantation mask, defining impurities on the semiconductor body. The implantation mask may, for example, be a photolithographically patterned hard mask or resist mask.

With a lateral structuring of the field stop zone, it is possible to design a softer shutdown of IGBTs, as a charge carrier discharge can be controlled by a width and a spacing of the recesses in the field stop zone layer. By way of example, a thickness, in the range between 1 micron and 30 microns, or even between 2 microns and 7 microns, of the field stop zone or a field stop zone in the field stop zone stack may be defined depending on the choice of the field stop zone impurities and a subsequent use of temperature. Typical implantation energies and doses of the impurities to the definition of a field stop layer are phosphorus (P) as impurity in the range from 50 keV to 200 keV and $2\times10^{11}$ cm$^{-2}$ to $1\times10^{13}$ cm$^{-2}$ or $4\times10^{11}$ cm$^{-2}$ to $2\times10^{12}$ cm$^{-2}$.

The formation of the drift region layer 110 is followed by a processing of the semiconductor body at the first side 101, e.g. at a front side of the semiconductor body 100. This further processing provides, for example, the formation of semiconductor zones within the drift region 110. For example, implantation and/or diffusion of impurities into the drift region layer 110 may provide doped semiconductor regions within the drift zone region layer 110, e.g. the formation of an anode of a diode power of body and source of a vertical IGBTs or MOSFETs. Also, the formation of one or more wiring layers with intermediate compounds may be achieved.

As part of the processing at the first side 101, elements are shown as being produced in the simplified schematic cross sectional view of FIG. 1B in the form of squares 125 on the first side 101.

As shown in the schematic cross-sectional view of FIG. 1C, a portion of the semiconductor body 100 may be removed from the second side 102. A border of the ablated area of the semiconductor body 100 is schematically illustrated by a dashed line. A removal direction is marked with arrows 109. The semiconductor body 100 is preferably removed from the second side 102 with an electrochemical etching process, wherein the pn junction and the plane spanned by the pn junction charge space region is an etch stop for terminating the etching process. Upon reaching this etch stop/stops the etching process terminates automatically and is self-aligned in this manner. Thus, a precise removal of the semiconductor body 100 from the second side 102 is possible and thus a precise adjustment of the final thickness of the semiconductor device may be achieved. This lowers the fluctuations in the final thickness of the semiconductor device. As an etch stop, for example, a characteristic change of a current flowing within the electrochemical etching current is used when reaching the etch stops, i.e. of the pn junction, which is used for terminating the etching process. At the beginning of the removal from the second side 102, mechanical removal methods can also be used.

Electrochemical etching is not required. Rather, etching with a strongly alkaline medium, such as an aqueous KOH or TMAH solution, may be used. When using boron as the impurity 105 in a weakly p- or n-doped semiconductor body 100, a complete impurity implantation may be achieved with high boron doping (e.g., $>10^{19}$ cm$^{-3}$) used as an etch stop.

After the removal of the semiconductor body 100 of the second side 102, up to the impurity 105 defined pn junction or the plane spanned by the pn junction depletion region or up to the impurities 105 defined dopant concentration, further processing of the body 100 may occur. For example, by way of the impurity 105 defined pn junction, the semiconductor 100 may provide a collector-side emitter of a IGBTs, the cathode-side emitter of a diode or the drain of the MOSFET.

FIGS. 2A to 2F are schematic cross-sectional views of a semiconductor body during the manufacture of a semiconductor device according to another embodiment.

The schematic shows a cross-sectional view of a p-type semiconductor substrate 200, such as a p-type semiconductor substrate made of Si, with an optional implantation of boron into a surface region on a first side 201 of the p-type semiconductor substrate 200.

A schematic profile of implanted boron 215 is shown as a depth according to the illustrated y axis and amplitude is shown by the x axis.

Figure 2A:
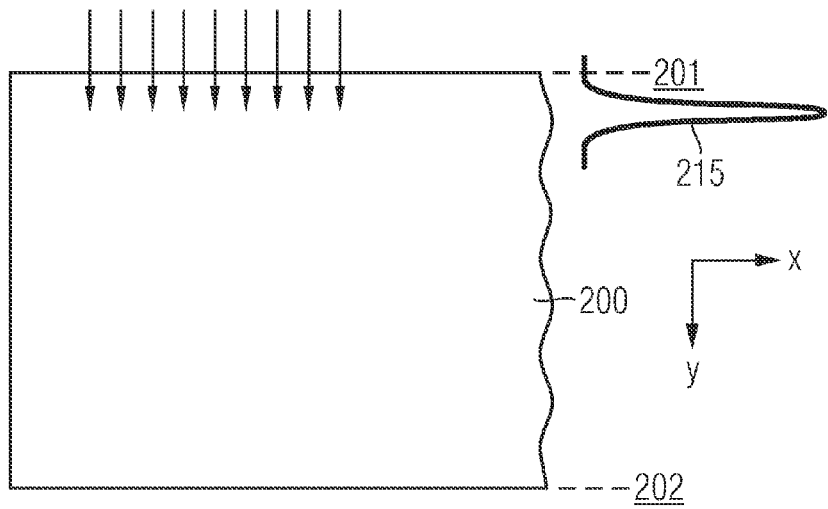
FIG. 2A-2F illustrate schematic cross sectional views of a semiconductor body during a process for manufacturing a semiconductor device in which at least one n-type field stop zone is defined.
Figure 2B:
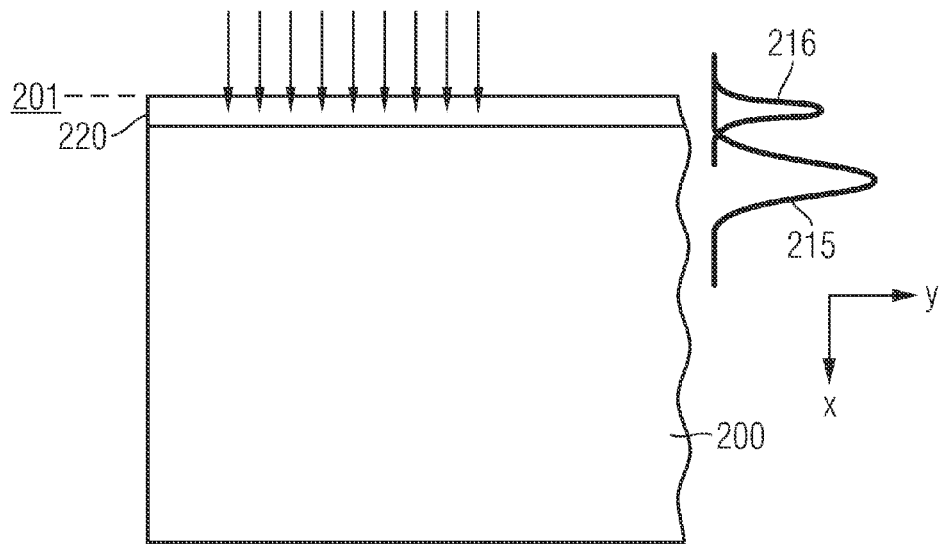

As shown in the schematic cross-sectional view of the semiconductor substrate 200 in FIG. 2B, a semiconductor layer 220 is formed on the first side 201 of the semiconductor substrate 200, e.g. by epitaxial growth of the semiconductor layer 220 as a Si layer on a p-type silicon substrate. Then, n-type impurities, for example a material or a material combination of phosphorus, arsenic, antimony, selenium and sulfur, with a base material made e.g. Silicon, may be implanted on the first side 201 into the first semiconductor layer 220 (see, schematically illustrated profile 216). The semiconductor layer 220, for example, may have a thickness of 1 micron to 10 microns or even from 2 microns to 7 microns. Depending on the temperature budget during formation of the semiconductor layer 220, an annealing process may be provided to provide a broadening of the optional boron implantation profile. This is shown in FIG. 2B schematically by a lower relative to peak impurity implantation of boron and by a comparatively large width of the implantation profile shown schematically by reference numeral 215.

The semiconductor layer 220 may be patterned, by photolithography for example, before or after implantation of the n-type impurities into the semiconductor layer 220.

Figure 2C:
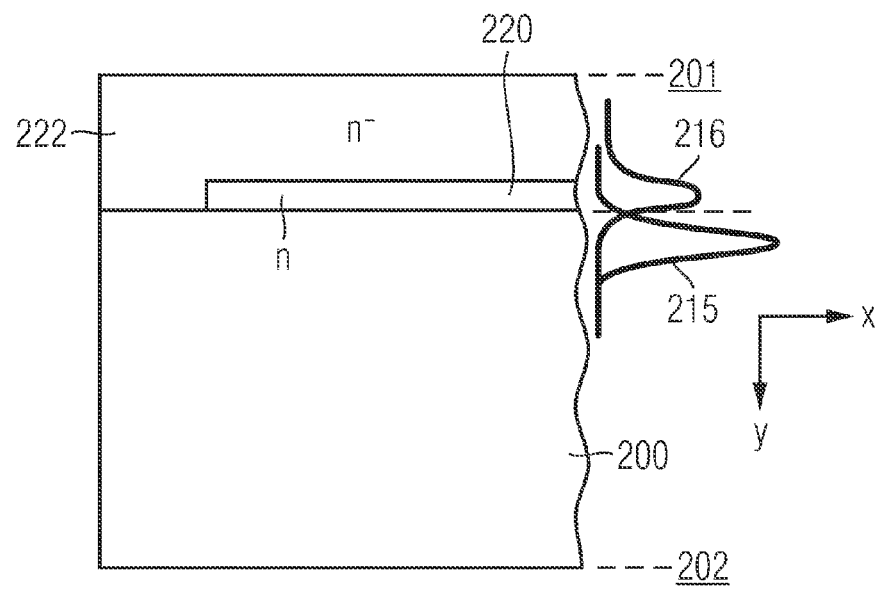

As shown in the schematic cross-sectional view of FIG. 2C, which will be optional to the structured first semiconductor layer 220, a second semiconductor layer 222 may be formed by epitaxial growth. The second n$^-$ type semiconductor layer 222 provides a drift zone layer of the semiconductor device to be formed. A dopant concentration and a thickness of the second semiconductor layer 222 is a function of the requirements for the manufactured semiconductor device, such as the necessary dielectric strength.

Figure 2D:
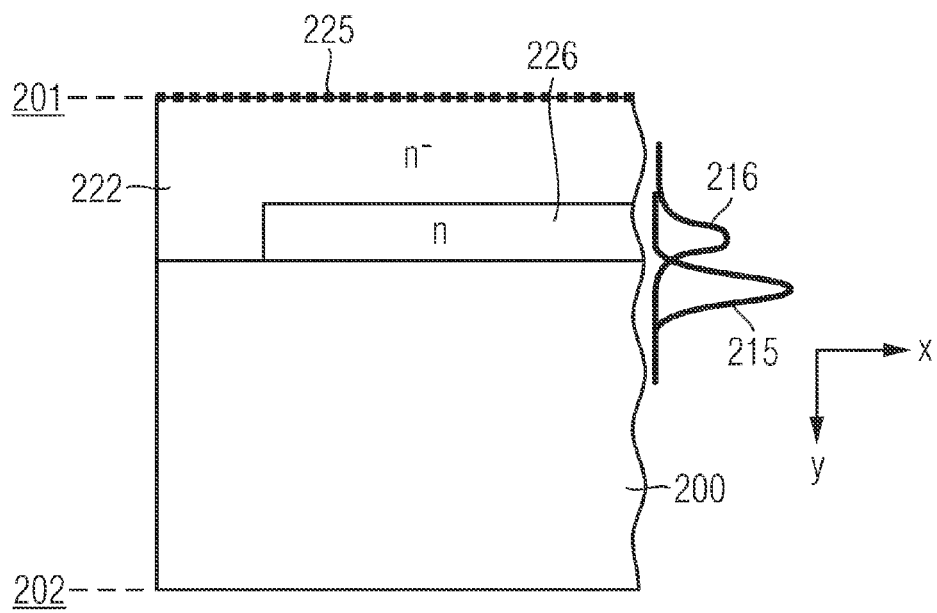

As illustrated in the cross-sectional view of FIG. 2D, the formation of the drift zone layer constituting the second semiconductor layer 222 may be on the first side 201, e.g. a front side. Impurities may be introduced into the semiconductor body, e.g. by implantation and/or diffusion, which are defined or buried in the layer 201 and the first semiconductor zones ranging from n-type and/or p-type. Depending on the nature of the manufactured semiconductor device, for example a diode, field effect transistor, and bipolar transistor, these further semiconductor zones may be associated with source, body, and/or anode emitters. A wiring portion may also be applied to the first side 201, e.g. by forming one or more conductive layers, such as metallization, which is structured as a wiring pattern, e.g. as a line track pattern, and between which there may be intermediate dielectric layers. A conductive connection between conductors at different levels can be generated, for example, through contact openings in the interlayer dielectric layers.

As part of the processing at the first side 201, elements may be produced and are shown in the form of squares 225 over the first side 201.

Figure 2E:
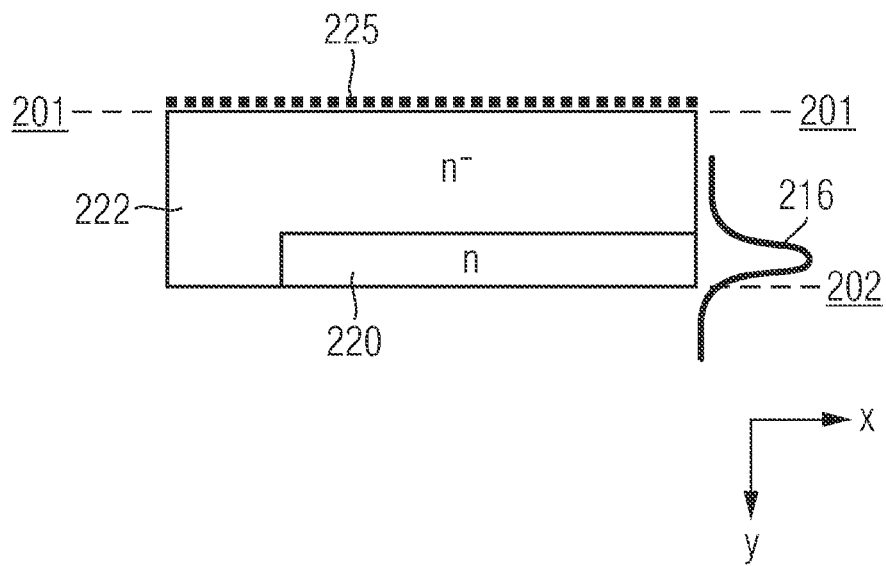

As shown in FIG. 2E, a thinning of the semiconductor substrate 200 may be performed from the second side 202. The removal of the semiconductor body 200 may be achieved using an electrochemical process, including the n-doped profile 216 and the p-doped profile 215 defined pn junction (see FIG. 2D) or its space charge zone. The removal of the semiconductor body 200 may also take place in an alkaline etching and terminate at the previously introduced boron-doped layer. Thus, a precise removal of the semiconductor body 100 of the second side 202 may be achieved, whereby a lowering of the fluctuations in the final thickness of the semiconductor device is achieved.

Figure 2F:
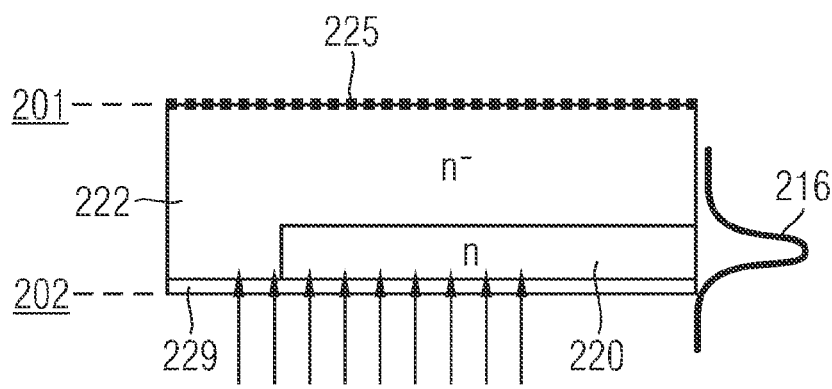

As shown in FIG. 2F, processing may be performed to the second side 202. In one example, a produced highly doped layer is produced in a region 229 by implantation of corresponding impurities from the second side 202. Such a layer may include, for example, a cathode of a diode emitter, a highly doped drain region of a FET or a collector side emitter of an IGBT. Similarly, a training connection or a contact layer such as a metal layer may be provided on the second side 202. If the p-doped layer region 215 serves as an etch stop, this doping layer region can also be seen as p-doped emitters.

Figure 3:
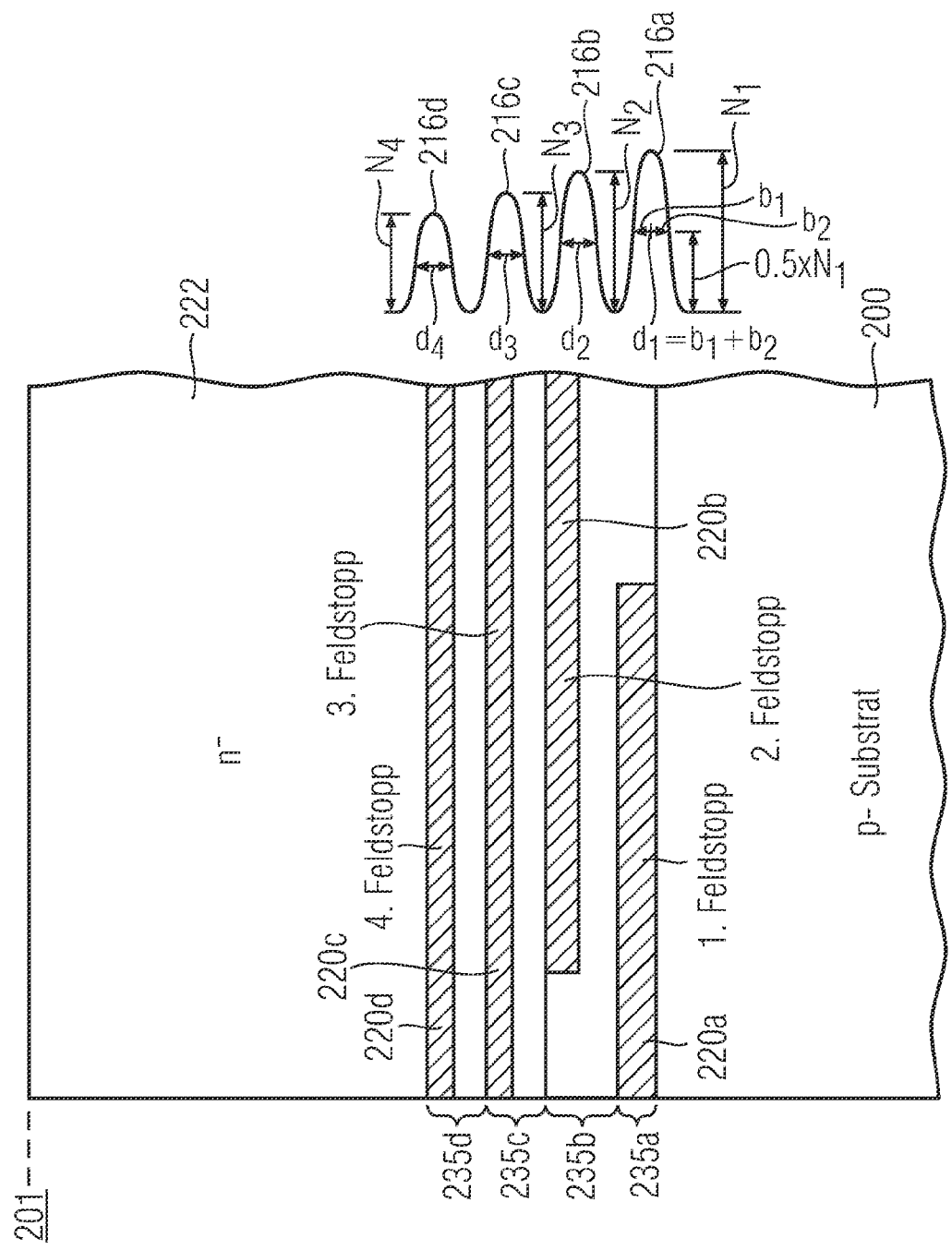
FIG. 3 illustrates a cross sectional view of a semiconductor body during a process for manufacturing a semiconductor device wherein within a drift region of the n-type, a plurality of p-type field stop zones are formed.

Alternatively to the FIG. 2C embodiment having a first semiconductor layer 220 and a drift zone layer constituting the second semiconductor layer 222, an embodiment, as shown in FIG. 3 shows a schematic cross-sectional view, may include a layer stack having first to fourth field stop zones 220a, 220b, 220c, 220d formed, for example, before the drift region layer 222 is formed. In the illustrated example, the lowest field stop zones 220a, 220b may be differently structured. Of course, these layers can be formed unstructured. By structuring the field stop zone layers 220a, 220b, for example, a softer switching off of IGBTs may be achieved, in particular by controlling the charge carrier discharge means provided by the width and spacing of the recesses in one or more of the field stop layers. The field stop zones 220a, 220b, 220c, 220d can, for example, be produced in successively grown semiconductor layers 235a, 235b, 235c, 235d by masked or unmasked implantation of impurities, the respective implantation is performed for example by deposition of each individual layer. According to one embodiment a width d1, d2, d3, d4 and a dopant concentration 216a, 216b, 216c, 216d of the first through fourth field stop zones 220a, 220b, 220c, 220d varies based on a distance from the substrate 200. This relationship is captured by d4<d3<d2<d1. Likewise, an amplitude N1, N2, N3, N4 of the dopant concentration in the first to first to fourth field stop zones 220a, 220b, 220c, 220d varies based on a distance from the semiconductor substrate 200. This relationship is recognized by N4<N3<N2<N1. The four field stop zones, 220a, 220b, 220c, 220d may formed for example by matching dose. In such a case, the relationship d4<d3<d2<d1 may be around one in a particular example. According to another embodiment, a width d1, d2, d3, d4 of the dopant concentration 216a, 216b, 216c, 216d of the first through fourth field stop zones 220a, 220b, 220c, 220d are of increasing depth, i.e. with increasing distance from the semiconductor substrate 200. This case arises for example when a temperature budget for generating the field stop zone is negligibly small compared to the formation of the field stop zones.

The dopant profiles, for example, have different profiles produced by proton irradiation of an approximately Gaussian distribution. For each of the plurality of field stop zones, the relationship: $0.9 < b1/b2 < 1.1$ or $0.95 < b1/b2 < 1.05$ may be true. In FIG. 3 an example four field stop zones 220a, 220b, 220c, 220d are shown. Off course, the number of field stop zones is chosen by way of example only. Other numbers of field stop zones may be used as well (e.g., 1, 2, 3, 5, 6 and 7).

Figure 4:
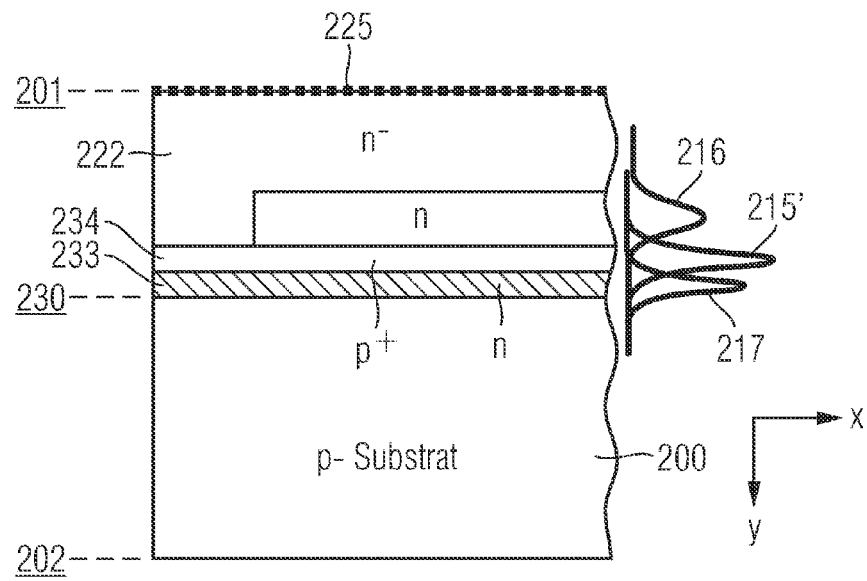
FIG. 4 illustrates an alternative embodiment of the schematic cross section view illustrated in FIG. 2D.

As an alternative to the embodiment shown in FIG. 2D can, as shown in FIG. 4 and in addition to that the shown in FIG. 2A that includes implantation of boron into the semiconductor substrate 200 (see associated profile 217 in FIG. 4), a further implantation of n-type impurities be carried out, were the n-type impurities are preferably implanted deeper into the semiconductor substrate 200 as the impurity boron (see associated profile 217 in FIG. 4). Such an additional implantation may be useful, for example, in the preparation of an IGBT. The removal of the substrate 200, in one example electrochemically, to a pn junction 230 that is formed by n-type impurities in the formed n-type semiconductor region 233 and the p-type semiconductor substrate 200. Subsequently, the implanted, by way of n-type impurities, and formed n-type semiconductor region 233, may be removed by alkaline etching, to the boron produced p+-type semiconductor layer 234. This p+-type semiconductor layer 234 serves as a collector side emitter of the IGBT and is generated approximately, a described in relation to FIG. 2A, by suitable choice of implantation dose and energy.

Figure 5:
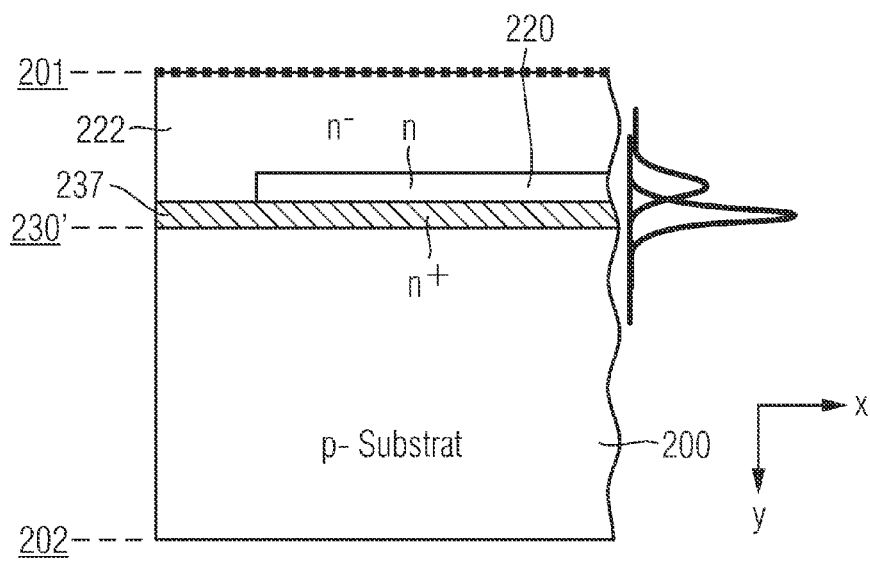
FIG. 5 illustrates an alternative embodiment of the schematic cross section views illustrated in FIG. 2D and FIG. 4.

As shown in FIG. 5, as an alternative embodiment, an n+-type semiconductor layer 237 in the semiconductor substrate 200 may be used below the semiconductor layer 220, e.g. under the implantation process shown in FIG. 2A, in which case boron as an n-type impurity is implanted.

Removal of the semiconductor substrate 200 may be achieved using an electrochemical process and ends at the pn junction 230'. The remaining n+-type semiconductor layer 237 may serve as a cathode emitter of a diode or as a drain of a FET. Thus, a precise removal of the semiconductor substrate 200 is possible and thus a precise adjustment of the final thickness of the semiconductor device, whereby a lowering of the fluctuations in the final thickness of the semiconductor device may be achieved.

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

The invention claimed is:

1. A method of manufacturing a semiconductor device, comprising:
    implanting impurities in a semiconductor body via a first side of the semiconductor body;
    forming a drift zone layer on the first side of the semiconductor body; and
    removing at least a portion of the semiconductor body from a second side of the semiconductor body being opposite of the first side, the removing of the semiconductor body terminating at least at a pn junction defined by the implanted impurities,
    wherein prior to implanting the impurities, forming a semiconductor layer on the first side of the semiconductor body; and
    implanting impurities in the semiconductor layer.

2. The method of claim 1, further comprising performing a plurality of impurity implanting acts thereby forming a layer stack have a plurality of layers with implanted impurities.

3. The method of claim 2, wherein an implantation dose of impurities for a first layer of the plurality of layers is greater than an implantation dose of impurities for a second layer of the plurality of layers.

4. The method of claim 2, wherein a width of an implantation profile of impurities in the plurality of layers of the layer stack decreases with increasing distance of a respective layer to the second side of the semiconductor body.

5. The method according to claim 2, wherein the impurities introduced into the semiconductor layer or in at least a semiconductor layer of the layer stack are introduced via an implant mask.

6. The method according to claim 1, wherein the semiconductor layer or the semiconductor layers of the layer stack each have a thickness in the range between 1 micron and 10 microns.

7. The method according claim 1, wherein a semiconductor substrate of the semiconductor body as a p-doped silicon substrate.

8. The method of claim 7, wherein prior to implanting the impurities into the semiconductor body, boron is implanted into the semiconductor body via the first side, whereby the boron is first implanted into the semiconductor body followed by performing the act of implanting the impurities into the semiconductor body.

9. The method according claim 1, wherein after the removal of at least a portion the semiconductor body, further comprising implanting further impurities into the semiconductor body.

10. The method according to claim 1, wherein after the removal of at least a portion of the semiconductor body, defusing further impurities into the semiconductor body.

11. The method according to claim 1, wherein the impurities are from one or more of the materials phosphorus, arsenic, antimony, selenium, sulfur.

12. The method of claim 1, wherein after the removal of at least a portion of the semiconductor body no further implantation of impurities into the semiconductor body is performed.

13. The method of claim 12, wherein the semiconductor device is formed as insulated gate bipolar transistor and implanting the impurities into the semiconductor body of silicon is carried out with boron as an impurity.

14. The method of claim 13, wherein the boron is implanted prior to depositing a first semiconductor layer on a semiconductor substrate of the semiconductor body of.

15. The method of claim 13, wherein after the deposition of a first semiconductor layer on a semiconductor substrate of the semiconductor body the boron is implanted into the first semiconductor layer over the first side.

16. The method according to claim 13, further comprising implanting an n-type impurity into the semiconductor body via the first side and, an implantation depth of the n-type impurity to the first side is greater than an implantation depth of boron.

17. The method according to claim 1, wherein the semiconductor device is formed as a diode or metal-oxide-semiconductor field effect transistor and implanting the impurities into the semiconductor body of silicon includes implanting an n-type impurity material.

18. The method according to claim 1, wherein after the implantation of impurities into the semiconductor body and prior to forming the drift zone layer, a surface region on the first side is melted for limited duration and recrystallized.

19. A semiconductor device comprising:
    a semiconductor body having a first side and a second side;
    one or a plurality of field stop zones are formed within the semiconductor body, the one or each of the plurality of field stop zones having a vertical distance b1 from a maximum of a dopant concentration to a half maximum of the one or each of the plurality of field stop zones in the direction of the first side and a vertical distance b2 from the maximum of the dopant concentration to the half maximum in the direction of the second side of the semiconductor body, wherein $0.9 < b1/b2 < 1.1$.

20. The semiconductor device according to claim 19, wherein the one or at least one of said plurality of field stop zones is in a plane parallel to the first and second sides.

21. The semiconductor device according to claim 19, wherein a width of the dopant concentration in the depth direction in the plurality of field stop zones is in the range 1 microns to 30 microns.

22. The semiconductor device according to claim 19, wherein the semiconductor device is an IGBT, a MOSFET or a diode.

23. The semiconductor device according to claim 19, wherein the dopant concentration of adjacent field stop zones of the plurality of field stop zones overlap.

* * * * *